(12) United States Patent
Nakayama et al.

(10) Patent No.: US 6,768,118 B2
(45) Date of Patent: Jul. 27, 2004

(54) ELECTRON BEAM MONITORING SENSOR AND ELECTRON BEAM MONITORING METHOD

(75) Inventors: Yoshinori Nakayama, Sayama (JP); Yasunari Sohda, Kawasaki (JP); Hiroya Ohta, Kodaira (JP); Norio Saitou, Tokorozawa (JP); Masato Muraki, Inagi (JP); Masaki Takakuwa, Tokyo (JP)

(73) Assignees: Hitachi, Ltd., Tokyo (JP); Canon Kabushiki Kaisha, Tokyo (JP); Advantest Corporation, Tokyo (JP)

( * ) Notice: Subject to any disclaimer, the term of this patent is extended or adjusted under 35 U.S.C. 154(b) by 0 days.

(21) Appl. No.: 10/350,188

(22) Filed: Jan. 24, 2003

(65) Prior Publication Data

US 2004/0026627 A1 Feb. 12, 2004

(30) Foreign Application Priority Data

Aug. 8, 2002 (JP) .................................... 2002-231208

(51) Int. Cl.[7] .................................................. H01J 3/26
(52) U.S. Cl. .................... 250/397; 250/396 R; 250/281
(58) Field of Search ................................. 250/281, 282, 250/396 R, 397

(56) References Cited

U.S. PATENT DOCUMENTS

| 4,816,693 A | * | 3/1989 | Rathmell | 250/492.2 |
| 6,456,019 B1 | * | 9/2002 | Gordon et al. | 315/383 |
| 6,683,308 B2 | * | 1/2004 | Itagaki et al. | 250/310 |

FOREIGN PATENT DOCUMENTS

| JP | 3-48190 | 3/1991 |
| JP | 8-179046 | 7/1996 |
| JP | 11-176365 | 7/1999 |

* cited by examiner

Primary Examiner—John R. Lee
Assistant Examiner—Erin-Michael Gill
(74) Attorney, Agent, or Firm—Mattingly, Stanger & Malur, P.C.

(57) ABSTRACT

The present invention provides a beam monitoring sensor which can offer both high beam monitoring precision and high speed monitoring in a multi-electron beam writing system and a monitoring method using the same.

In a Faraday cup for electron beam monitoring, tantalum or a heavy metal material having an atomic number larger than that of tantalum is used to provide a Faraday cup construction having a high aspect ratio. The micro Faraday cup permits electron beam monitoring having less beam leak to a high acceleration electron beam.

11 Claims, 10 Drawing Sheets

ELECTRON BEAM MONITORING SENSOR AND ELECTRON BEAM MONITORING METHOD

BACKGROUND OF THE INVENTION

The present invention relates to a technique monitoring a characteristic such as a current value of an electron beam.

For prior art electron beam monitoring, a Faraday cup having a large hole of about several millimeters provided on a stage is used.

In this case, to efficiently absorb an incident electron beam, as the material of the Faraday cup, a relatively light metal having a small back scattering coefficient or a silicon (Si) substrate as described in Japanese Patent Application Laid-Open No. 3-48190 is optimal.

In order to achieve high-throughput of an electron beam writing system, a multi-beam writing system (multi-electron beam writing system) performing writing or monitoring using multiple beams at the same time is required. In such multi-beam writing system, micro electron beams are arrayed in a small region at high density. In order that they each pass through an electron optical system, beam monitoring must be performed for each of the beams. It takes time to monitor such multiple beams one by one using one Faraday cup.

Japanese Patent Application Laid-Open No. 11-176365 shows a system in which a plurality of lens tubes and Faraday cups opposed thereto are arranged. The prior art micro Faraday cups of a relatively light metal or a silicon substrate arranged at high density are used. Most of an incident electron beam passes through the Faraday cups. Precise monitoring cannot be done.

Japanese Patent Application Laid-Open No. 8-179046 shows an example using Faraday cups of gold (Au) for ion beam monitoring. This copes with charging due to oxidation when an oxygen ion beam is irradiated. Gold is used as an inactive material.

An object of the present invention is to provide a beam monitoring sensor which can offer both high beam monitoring precision and high speed monitoring in a multi-electron beam writing system and a monitoring method using the same.

SUMMARY OF THE INVENTION

To solve the above problems, in the present invention, as the member of an electron beam collecting part forming Faraday cups monitoring an electron beam characteristic, tantalum (Ta), a heavy metal having an atomic number larger than that of Ta (for example, W (tungsten), Au and so on), or a compound having them as a main constituent is used.

In this case, the number of back scattered electrons from the bottom surface of the Faraday cup is increased. When the Faraday cup has a deep hole having an aspect ratio above 4, a micro Faraday cup having a good absorbing efficiency is enabled. When the Faraday cup hole size is small toward its top, the back scattered electrons can be confined more reliability. Precise monitoring can be realized.

A plurality of such Faraday cups are arranged at high density to respond to multiple beams. The pitch of the Faraday cup array is the same as that of the array of electron beams monitored or an integral multiple thereof. The multiple beams can be monitored precisely at the same time. In this case, the minimum value of the pitch of the Faraday cup array depends on the acceleration voltage of the electron beam monitored and the material element. When it is larger than the pitch of the electron beam array, only the beam opposed to the Faraday cup array is turned on for monitoring. The unmonitored beam is monitored whenever necessary by beam deflection or stage movement corresponding to the Faraday cup array. A high speed process is enabled.

When the Faraday cup array is required to be denser so as not to prevent beam transmission completely, a leak ratio from the Faraday cup is obtained. A contribution of the adjacent Faraday cup to a monitored value is assumed. A beam current can be monitored by a value obtained by the addition of an absorbed current of the irradiated Faraday cup and the contribution to a current value of the adjacent Faraday cup. Otherwise, an electrode layer is provided on the underlayer of the Faraday cup to apply a negative voltage thereto, producing a negative acceleration in the incident electron. Leak from the Faraday cup can be thus prevented. This permits precise current value monitoring of an electron beam incident upon the respective Faraday cups.

Representative construction examples of the present invention will be shown below.

(1) An electron beam monitoring sensor, which has a Faraday cup having an electron beam collecting part for monitoring an electron beam characteristic and forms the member of the electron beam collecting part by tantalum, a heavy metal having an atomic number larger than that of tantalum, or a compound having at least one of the heavy metals as a main constituent.

(2) The electron beam monitoring sensor, wherein the electron beam collecting part is of a recess shape having a hole, the thickness of the bottom surface and the side wall of the recess shape is larger than a range of an electron beam monitored, and the depth of the recess shape is above four times the size of the hole.

(3) The electron beam monitoring sensor, wherein the size of the hole of the recess shape is small toward its top.

(4) The electron beam monitoring sensor, wherein the member of the electron beam collecting part is formed by any one of heavy metals including tantalum, tungsten and gold.

(5) The electron beam monitoring sensor, wherein a plurality of the Faraday cups are arrayed at a predetermined pitch in two dimensions corresponding to multiple electron beams.

(6) The electron beam monitoring sensor, wherein the array pitch of the Faraday cups is larger than twice the range of the electron beam of the electron beam collecting part, and is the same as the pitch of multiple electron beams monitored or an integral multiple thereof.

(7) The electron beam monitoring sensor, wherein the plurality of Faraday cups are formed on the same substrate having a dielectric layer inserted therein.

(8) The electron beam monitoring sensor, wherein the plurality of Faraday cups are each connected to an ammeter for monitoring an electric current of an electron beam by each wire, and the wires are formed by a multi layer structure in the substrate.

(9) An electron beam monitoring method, which has the step of irradiating multiple electron beams onto a plurality of Faraday cups arranged in two dimensions at an array pitch of an integral multiple of the beam pitch of the multiple electron beams and formed by tantalum or a heavy metal having an atomic number larger than that of tantalum so as to monitor a beam current of each of the electron beams, and stops irradiation of the electron beam of the multiple electron beams not opposed to the Faraday cup to selectively irradiate only the electron beam opposed to the Faraday cup onto the Faraday cup, thereby monitoring the beam current by an absorbed beam current of each of the Faraday cups.

(10) An electron beam monitoring method, which has the step of irradiating multiple electron beams onto a plurality of Faraday cups arranged in two dimensions at an array pitch of an integral multiple of the beam pitch of the multiple electron beams and formed by tantalum or a heavy metal having an atomic number larger than that of tantalum so as to monitor a beam current of each of the electron beams, and monitors the each beam current by the addition of an absorbed beam current of a first Faraday cup of the plurality of Faraday cups onto which the electron beam is irradiated and part of an absorbed beam current of a second Faraday cup adjacent to the first Faraday cup.

(11) The electron beam monitoring method, wherein while applying a negative voltage to the Faraday cup, an electron beam is irradiated onto the position opposed to the Faraday cup.

DETAILED DESCRIPTION OF THE PREFERRED EMBODIMENTS

Preferred embodiments of the present invention will be described below with reference to the drawings.

Figure 1A:
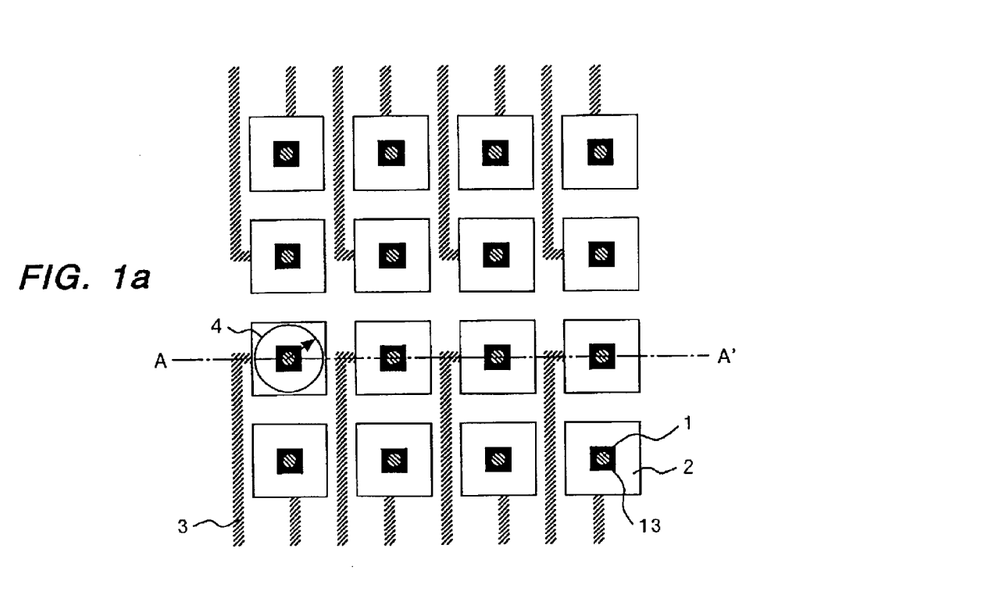
FIGS. 1a and 1b are diagrams of assistance in explaining a basic construction of Faraday cups for electron beam monitoring of the present invention.
Figure 1B:
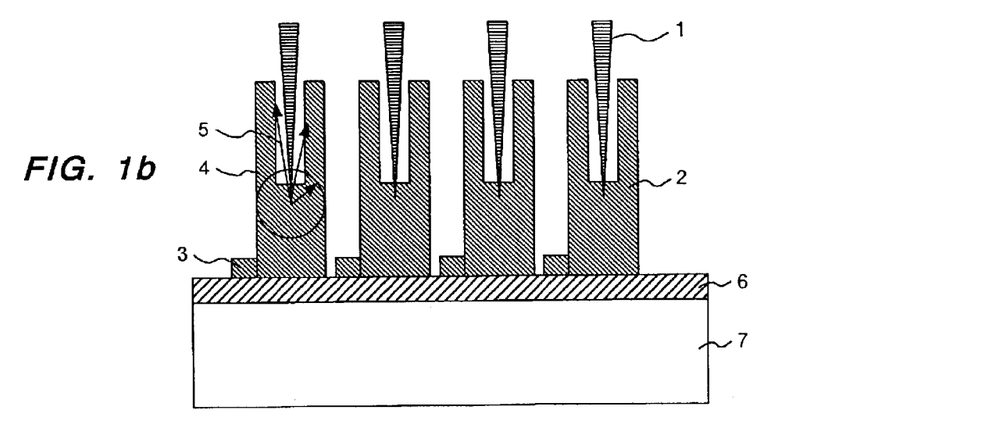

FIG. 1a is a top view of assistance in explaining a basic construction of an embodiment of the present invention. FIG. 1b is a cross-sectional view taken along line A–A' thereof. FIG. 1a is a construction example in which a plurality of Faraday cups 2 are arrayed in two dimensions and shows a state that an electron beam 1 is irradiated onto a recess part (recess-shaped hole) 13 of the Faraday cup 2. The Faraday cups 2 are connected to each ammeter (not shown) by each wire 3.

Figure 2:
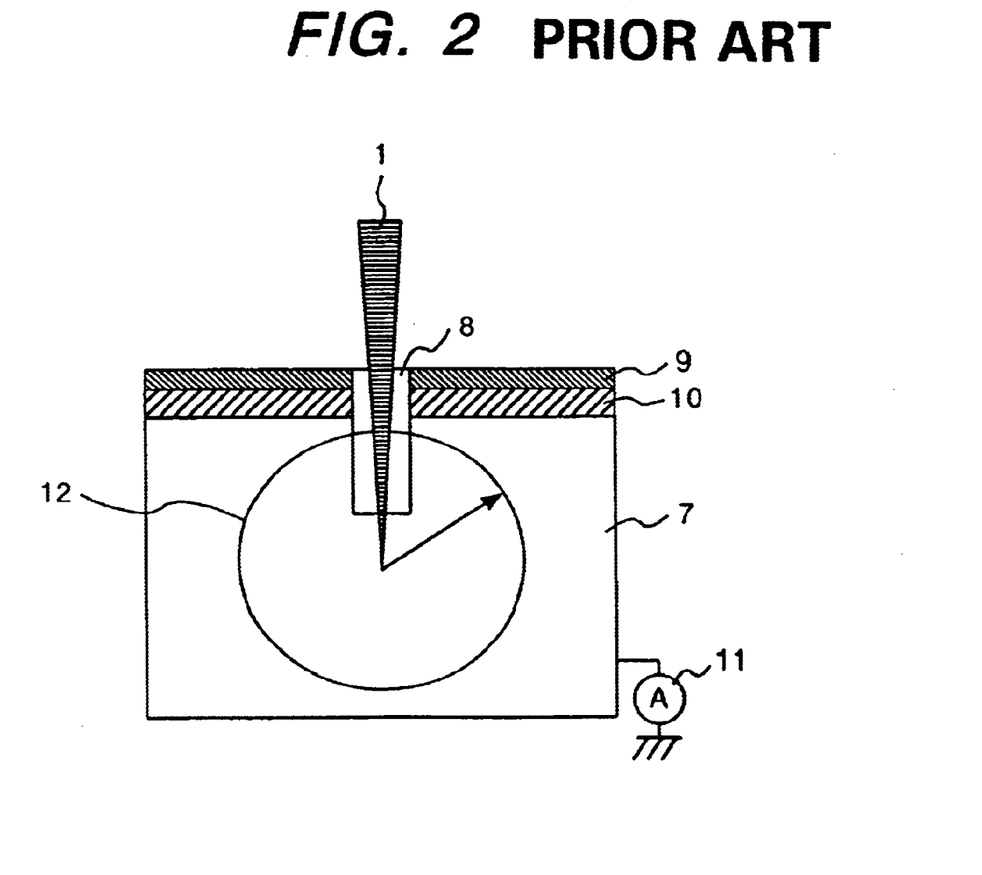
FIG. 2 is a diagram showing a prior art Faraday cup for electron beam monitoring.

FIG. 2 shows a prior art monitoring method using a Faraday cup. As shown in FIG. 2, in the prior art, a recess-shaped hole 8 is made in a silicon substrate 7 having a dielectric layer 10 and a conductive shield layer 9. The electron beam 1 is irradiated thereonto to monitor a beam current by an ammeter 11. When the electron beam is incident into the material, it is transmitted and scattered in the material according to its acceleration voltage.

Figure 3:
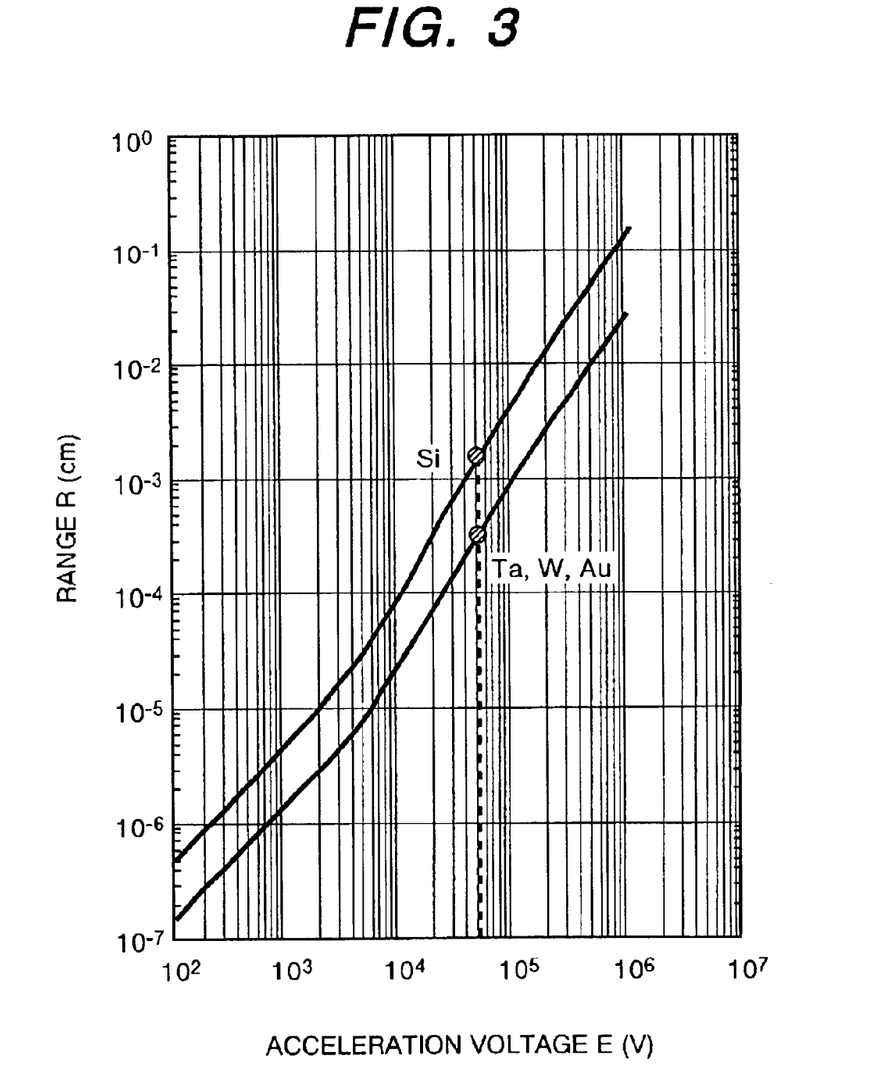
FIG. 3 is a diagram of assistance in explaining the relation between an electron beam acceleration voltage and a range.

The transmission depth is called a range (R). As shown in FIG. 3, it is determined by an acceleration voltage (E) of the electron beam and the concentration of the material composition. When an electron beam having an acceleration voltage of 50 kV used in a writing system is incident upon the silicon substrate, its range is about 20 $\mu$m.

On the contrary, in tantalum and a heavy metal (W, Au and so on) having an atomic number larger than that of tantalum, its range is small as about 2 $\mu$m. When the materials are used to manufacture a Faraday cup for current monitoring and the incident electron beam is confined completely in the Faraday cup, the thickness of the side wall and the bottom part of the recess-shaped hole 8 must be above about 20 $\mu$m for the silicon substrate and above about 2 $\mu$m for tantalum and a heavy metal having an atomic number larger than that of tantalum.

In the case of the electron beam having an acceleration voltage of 50 kV, in the prior art monitoring method using the Faraday cup shown in FIG. 2, an electron scattering 12 in the silicon substrate 7 is stopped at a radius of about 20 $\mu$m. The size of the Faraday cup must be at least about 40 $\mu$m in length, breadth and height.

Figure 4:
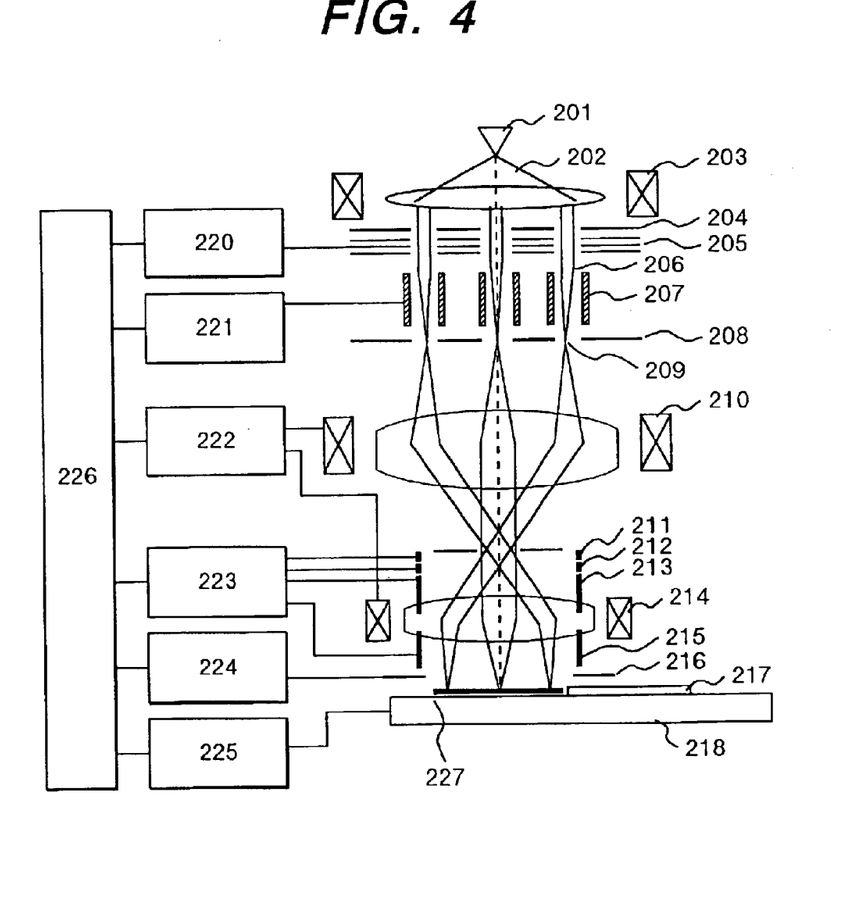
FIG. 4 is a schematic diagram showing a multi-electron beam writing system.

In a multi-electron beam writing system which can realize high speed writing, as shown in FIG. 4, an electron beam 202 emitted from a gun 201 is a collimated beam by a condenser lens 203 which is then separated by an aperture lens 204 and a lens array 205 to be multiple electron beams 206. Each of the beams 206 is turned on/off by a blanking array 207 and a blanking aperture 208. Only on electron beams 209 are condensed by a 1st projection lens 210 and a 2nd projection lens 214 and are then scanned all together on a wafer 217 mounted on a wafer stage 218 using a main deflector 213 and a sub deflector 215. The diagram shows a state that the beams are irradiated onto a Faraday cup array 227 for electron beam monitoring.

In the drawing, the numeral 211 denotes a dynamic focus adjuster; the numeral 212, a dynamic stigma adjuster; the numeral 220, a focus control circuit; the numeral 221, a dosage control circuit; the numeral 222, a lens control circuit; the numeral 223, a defection control circuit; the numeral 224, a signal processing circuit; the numeral 225, a stage control circuit; and the numeral 226, a CPU.

The processing speed is decided by the number of beams and the beam current. To perform writing at higher speed, a high-density electron beam array having a pitch size between multiple electron beams below 5 µm on the wafer is essential.

Figure 5:
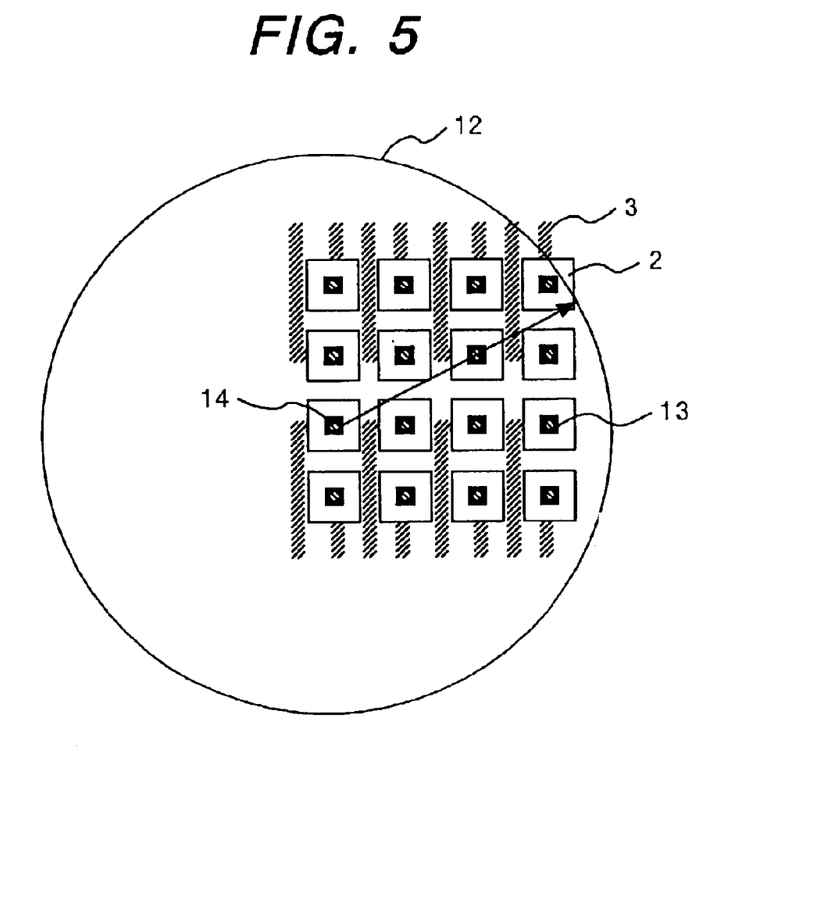
FIG. 5 is a diagram of assistance in explaining a prior art Faraday cup array for electron beam monitoring.

A silicon substrate is used as the material of the plurality of Faraday cups corresponding to the multi-electron beam writing system to array the Faraday cups 2 at a 5 µm pitch, as shown in FIG. 5. When a 50 kV electron beam 14 is incident, it is transmitted from the adjacent Faraday cup to the outer circumference in a circle range as shown in 12. It is difficult to monitor a precise electric current of the incident electron beam.

In the present invention, the plurality of Faraday cups 2 are formed using gold as a material. As shown in FIG. 1(*b*), when the thickness of the side wall and the bottom part of the recess-shaped hole 13 is above 2 µm to array the Faraday cups at a 5 µm pitch, an electron can be stopped in the Faraday cup 2, as shown in an electron scattering area 4. This can prevent the 50 kV electron beam 1 from being transmitted.

The number of back scattered electrons 5 is increased in tantalum and a heavy metal having an atomic number larger than that of tantalum. The depth of the Faraday cup is above four times the hole diameter. The scattered electrons 5 can be confined and absorbed in the Faraday cup without being released. The electrons absorbed in the Faraday cup are led through the wire 3 connected to each of the Faraday cups to the ammeter. The beam current can be monitored at the same time individually in each of the Faraday cups.

In the above embodiment, the 4×4 (length×breadth) Faraday cups are described. An example in which the Faraday cups are higher integrated will be described.

32×32 (length×breadth) Faraday cups arrayed at a 5 µm pitch are manufactured by the process shown in FIGS. 6 to 13. In FIGS. 6 to 13, the section of part of the 32×32 Faraday cups is shown. When the Faraday cups are arrayed at high density, a place for laying the wire from the inner Faraday cups to the ammeter disturbs other Faraday cup arrays.

Figure 6:
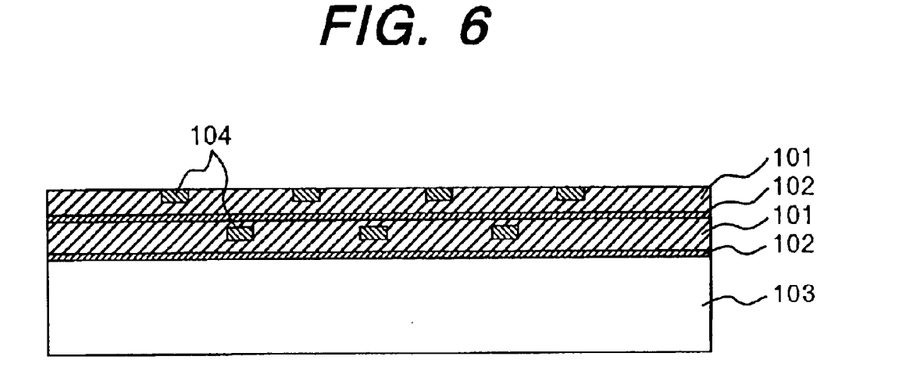
FIG. 6 is a diagram showing a manufacturing process (1) of a Faraday cup array for electron beam monitoring of the present invention.
Figure 7:
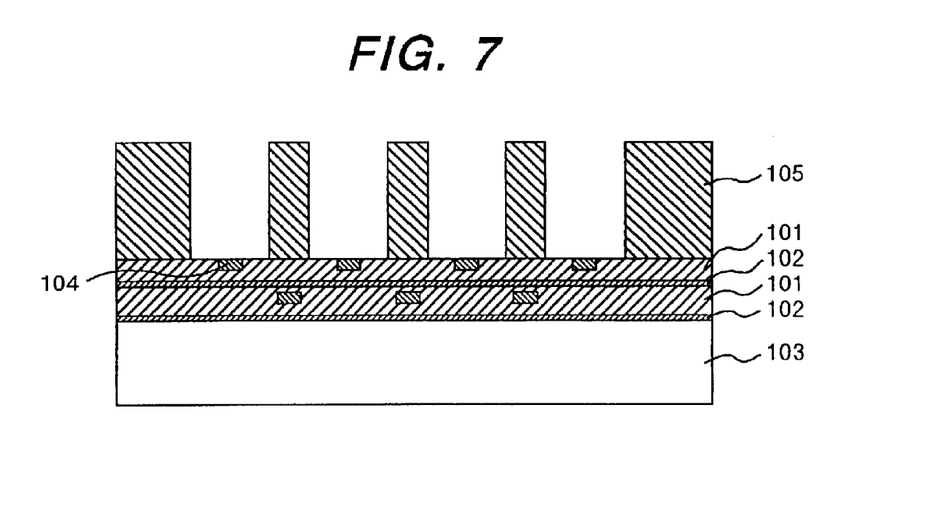
FIG. 7 is a diagram showing a manufacturing process (2) of a Faraday cup array for electron beam monitoring of the present invention.
Figure 8:
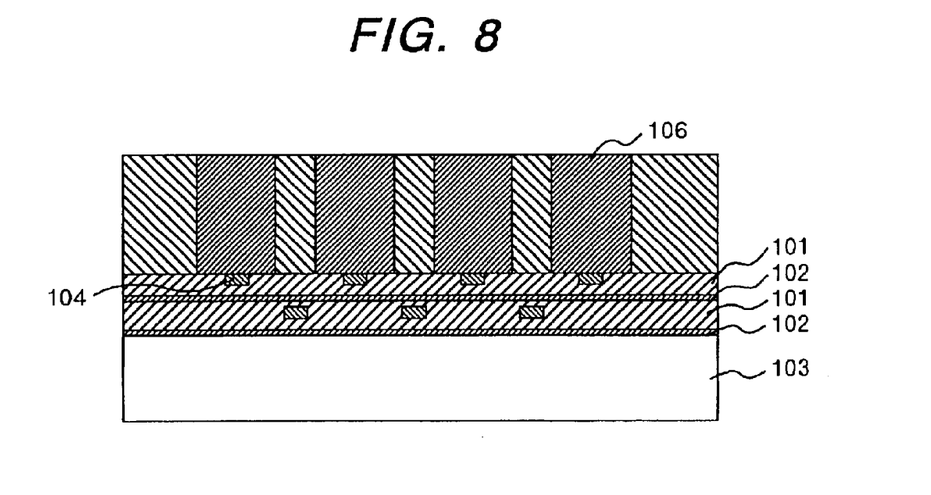
FIG. 8 is a diagram showing a manufacturing process (3) of a Faraday cup array for electron beam monitoring of the present invention.

These wires are of a multi layer structure in the substrate to enable integration. As shown in FIG. 6, oxide films 101 in which a gold thin film 102 and gold wires 104 are inserted are formed on a silicon substrate 103. As shown in FIG. 7, plating patterns are formed at a 5 µm pitch in resists 105 by a lithography process. As shown in FIG. 8, Faraday cup bases 106 having a height above 2 µm are formed by a gold plating process.

Figure 9:
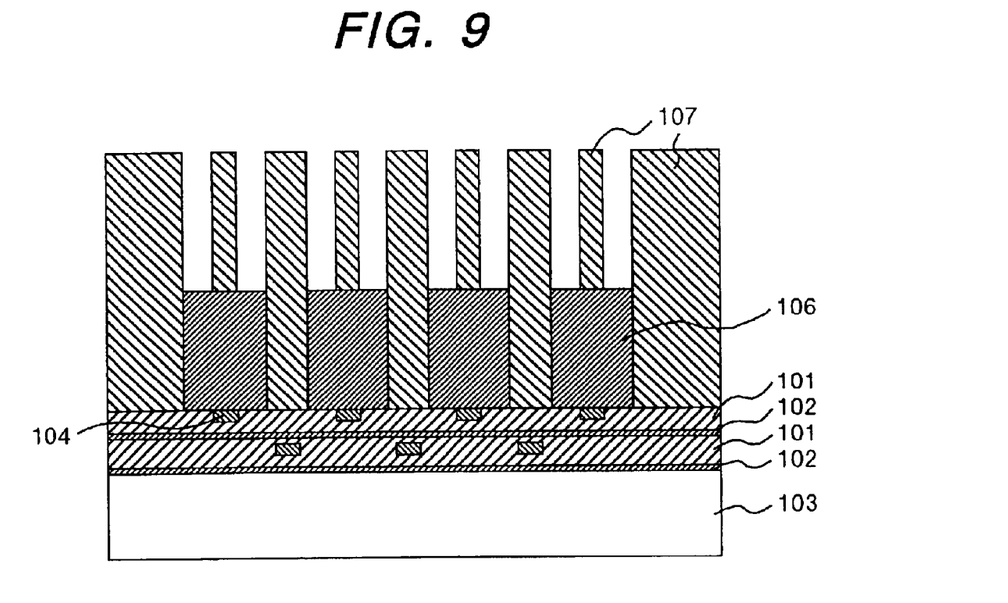
FIG. 9 is a diagram showing a manufacturing process (4) of a Faraday cup array for electron beam monitoring of the present invention.
Figure 10:
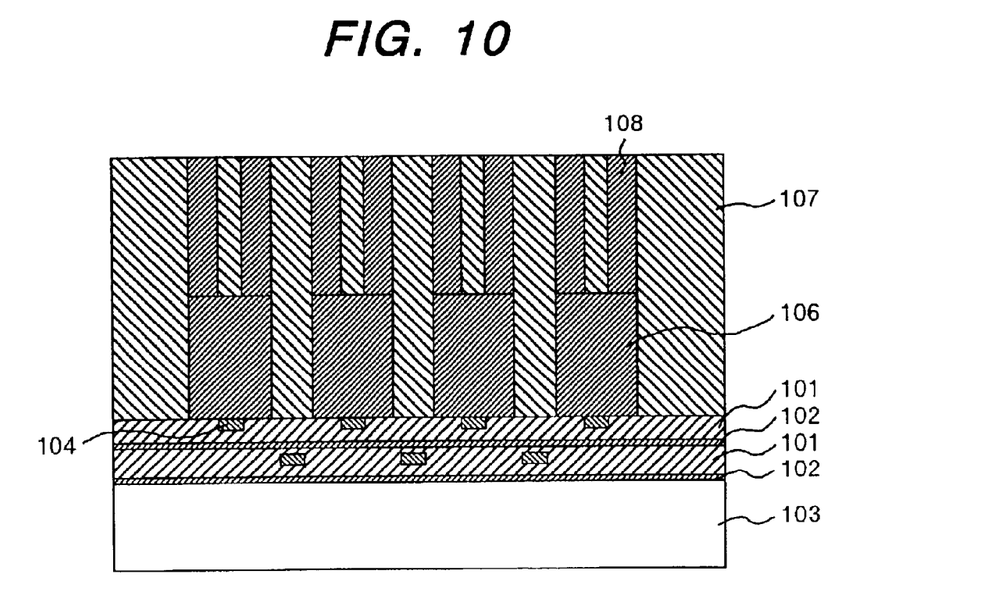
FIG. 10 is a diagram showing a manufacturing process (5) of a Faraday cup array for electron beam monitoring of the present invention.

Second layer gold plating patterns of resists 107 are formed by the lithography process shown in FIG. 9. Faraday cup holes are formed by the gold plating process as shown in FIG. 10.

Figure 11:
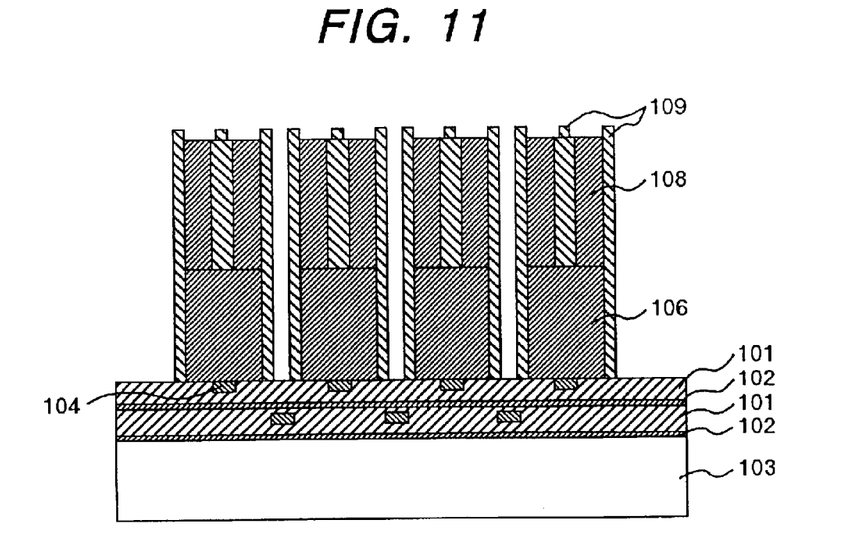
FIG. 11 is a diagram showing a manufacturing process (6) of a Faraday cup array for electron beam monitoring of the present invention.
Figure 12:
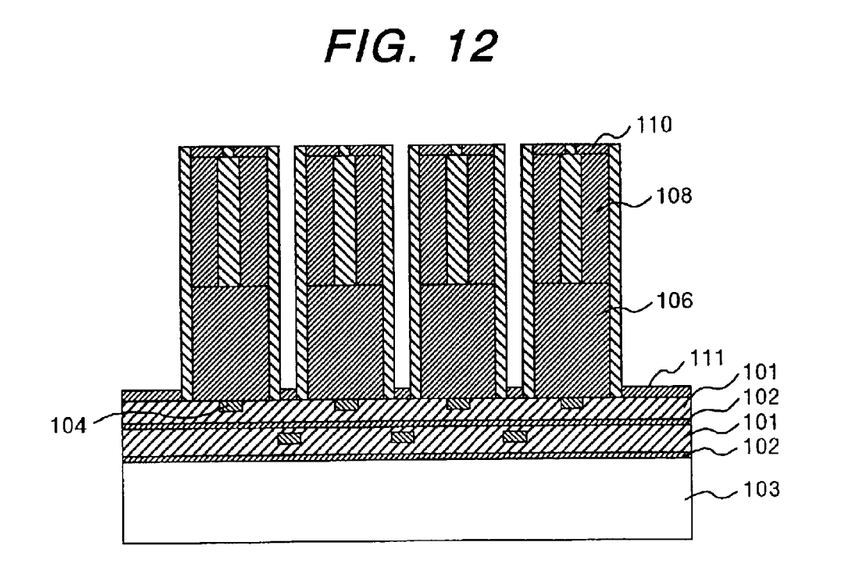
FIG. 12 is a diagram showing a manufacturing process (7) of a Faraday cup array for electron beam monitoring of the present invention.
Figure 13:
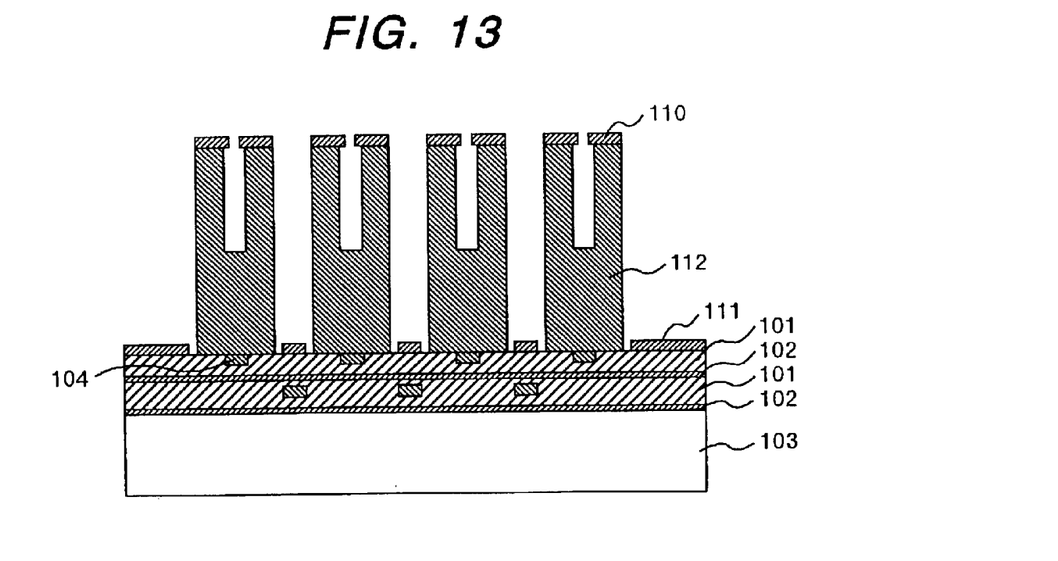
FIG. 13 is a diagram showing a manufacturing process (8) of a Faraday cup array for electron beam monitoring of the present invention.

In the lithography process shown in FIG. 11 and the plating process shown in FIG. 12, narrow hole layers (metals formed by plating) 110 are formed in the Faraday cup holes and gold thin films (metals formed by plating) 111 are formed to the respective Faraday cups to protect the surface by electrical isolation. Finally, as shown in FIG. 13, resists 109 are separated to complete Faraday cups 112.

Figure 14:
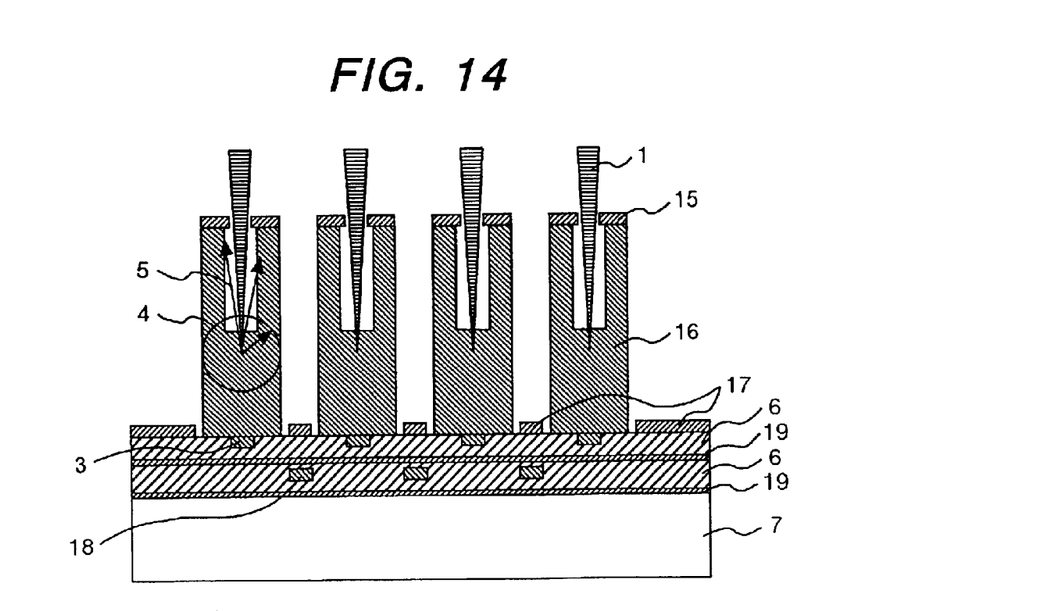
FIG. 14 is a diagram of assistance in explaining an example of the Faraday cup for electron beam monitoring according to the present invention.

The completed Faraday cups shown in FIG. 14 are mounted on the multi-electron beam writing system shown in FIG. 4. The wires 3, 18 from each of the Faraday cups are connected to the ammeter to perform electron beam current monitoring. 32×32 (length×breadth) electron beams 1 are arrayed at a 5 µm pitch. FIGS. 14 and 4 show part thereof.

A conductive layer 17 formed on the surface stacking the substrate 7, a conductive layer 19 and the dielectric layer 6 in that order is grounded. The blanking apertures 207, 208 shown in FIG. 4 turn off all the beams other than the beam of the 32×32 beams at the lower left seen from the top surface of the wafer. Only one beam is scanned on the Faraday cup array by the deflectors 213, 215. The relative position of the Faraday cup and the beam is detected by a detector 216. The deflectors 213, 215 are adjusted so as to irradiate the beam onto the lower left Faraday cup.

In the beam adjusting position, the beam scanning is performed at a position other than the Faraday cup 16. The gold shield layer 17 is formed between the Faraday cups. Wafer charging does not occur. Precise beam position adjustment is permitted.

The blanking apertures 207, 208 turn on all the beams to irradiate all the beams onto the opposed Faraday cups. The wires 3, 18 of all the Faraday cups are connected to the ammeters to monitor electric currents of all the electron beams at the same time. The Faraday cup is provided with a Faraday cup top layer 15 so that the hole is narrow. The back scattered electrons 5 of the beam can be confined efficiently in the Faraday cup to realize more precise current monitoring.

With regard to the monitoring time, in the prior art, beams are switched one by one to monitor each of them for over two seconds. Monitoring for over 2000 seconds is needed for 1024 beams. In the Faraday cups according to the present invention, the 1024 beams can be monitored at the same time. Monitoring including beam position adjustment is completed within one minute.

An embodiment in which the integration of the electron beam is increased will be described. When the pitch of the multiple electron beams is below 2 µm, a material having an atomic number larger than that of tantalum, that is, all materials are used as the Faraday cup material and an electron beam having an acceleration voltage above 50 kV is irradiated onto the Faraday cup at a pitch below 2 µm, the beam is leaked to the adjacent Faraday cup. In the material having an atomic number larger than that of tantalum, its distance is about 2 µm. When the side wall is below 1 µm, the beam is stopped in the adjacent Faraday cup.

In this case, a leak ratio is decided by only the acceleration voltage of the incident electron beam. Only the single beam is turned on for monitoring, and then, a beam leak ratio can be obtained to the adjacent Faraday cup. The leak ratio is obtained to all the Faraday cups. The leak ratio may be obtained once since it is repeated when the acceleration voltage is the same.

When all the beams are turned on, a current value of a specific beam can be obtained precisely by subtracting the leak of the adjacent beam from a current value of the opposed Faraday cup and adding the leak of the specific beam to the adjacent Faraday cup.

Another solving method when the pitch of the multiple electron beams is below 2 µm will be described. As described above, when the electron beam having an acceleration voltage above 50 kV is irradiated, the beam is leaked to the adjacent Faraday cup.

Figure 15:
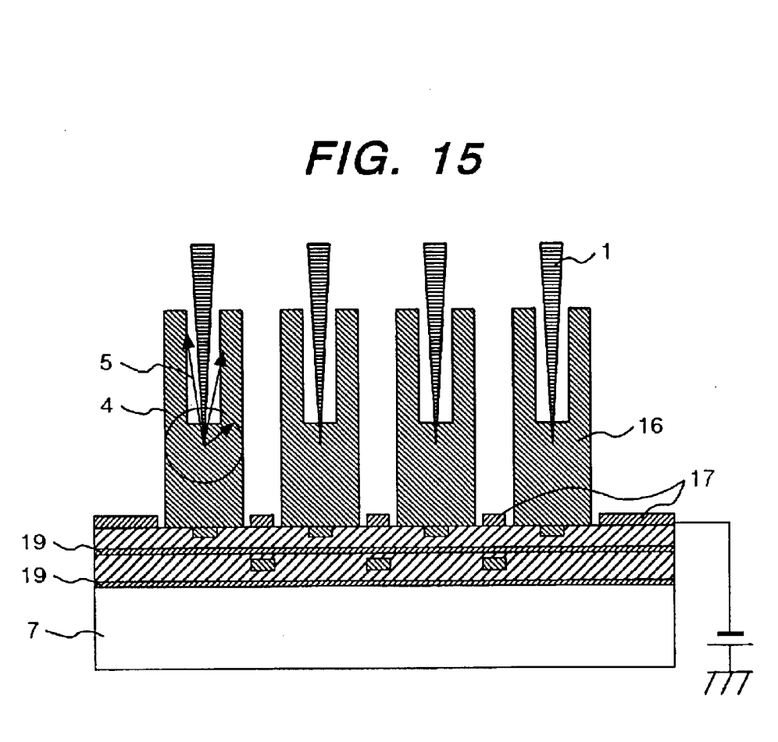
FIG. 15 is a diagram of assistance in explaining another example of the Faraday cup for electron beam monitoring according to the present invention.

As shown in FIG. 15, a negative voltage of −10 kV is applied to the conductive layer 17 of the surface of the Faraday cup. It is 40 kV when it is incident onto the Faraday cup. The incident electron is slowed immediately before the Faraday cup. The electron scattering area 4 is confined in the Faraday cup. The side wall of the Faraday cup is below 0.9 µm by gold plating. All the beams can be absorbed to the opposed Faraday cups without being leaked to the adjacent Faraday cup. Precise current monitoring is permitted.

A further solving method when the pitch of the multiple electron beams is smaller will be described. When the pitch of the multiple electron beams is small so that the above solving method cannot be coped with, the pitch size of the Faraday cup sensor array is an integral multiple of the pitch of the electron beams.

To calculate each of the beam currents, the electron beam of the multiple electron beams not opposed to the Faraday cup is stopped by the blanking apertures 207, 208. Only the electron beam opposed to the Faraday cup is selectively irradiated onto the Faraday cup to monitor the beam current by the absorbed beam current of each of the Faraday cups.

When the beam pitch is 1.5 µm, the pitch size of the Faraday cup sensor array is 3 µm. At beam current monitoring, the electron beam of the multiple electron beams not opposed to the Faraday cup, for example, every other beam array, is stopped by the blanking apertures 207, 208. Only the electron beam opposed to the Faraday cup is selectively irradiated onto the Faraday cup.

After completion of the monitoring, the deflectors 213, 215 move the electron beam not opposed to the Faraday cup, that is, every other beam array, to a position opposed to the Faraday cup. As described above, only the electron beam opposed to the Faraday cup is selectively irradiated onto the Faraday cup by the blanking apertures 207, 208. An electric current of the beam which cannot be monitored previously can be monitored to complete monitoring of all the beams.

In the above embodiment, the multiple exposure dosages are uniform. The beam dosage for each exposure is changed or multiple exposure in a finer position shift amount is added, permitting higher precision size control.

In this embodiment, the monitoring example using the electron beam having an acceleration voltage of 50 kV is shown. In the case of the lower acceleration voltage, the high precision monitoring is also permitted. In the case of an area of the higher acceleration voltage, the Faraday cup pitch is adjusted or the leak ratio is obtained for adjustment as shown in the above embodiment. Otherwise, a negative voltage is applied into the substrate. The same effect can be obtained.

As described above in detail, according to the present invention, in the Faraday cup for electron beam monitoring, Ta, a heavy metal material having an atomic number larger than that of Ta, or a compound having them as a main constituent is used. The micro Faraday cup without beam leak is permitted. The high precision electron beam monitoring corresponding to high integrated multiple beams can be realized.

According to the present invention, in the multi-electron beam writing system arrayed at high density, high speed electron beam monitoring can be done at high precision. The beam monitoring sensor which can cope with microfabrication and the monitoring method using the same can be realized.

What is claimed is:

1. An electron beam monitoring sensor, which has a Faraday cup having an electron beam collecting part for monitoring an electron beam characteristic and forms the member of said electron beam collecting part by tantalum, a heavy metal having an atomic number larger than that of tantalum, or a compound having at least one of the heavy metals as a main constituent, wherein the monitoring of an electron beam includes the addition of current leaked from a first faraday cup to an adjacent second faraday cup.

2. The electron beam monitoring sensor according to claim 1, wherein said electron beam collecting part is of a recess shape having a hole, the thickness of the bottom surface and the side wall of the recess shape is larger than a range of an electron beam monitored, and the depth of said recess shape is above four times the size of said hole.

3. The electron beam monitoring sensor according to claim 2, wherein the size of said hole of said recess shape is small toward its top.

4. The electron beam monitoring sensor according to claim 1, wherein the member of said electron beam collecting part is formed by any one of heavy metals including tantalum, tungsten and gold.

5. The electron beam monitoring sensor according to claim 1, wherein a plurality of said Faraday cups are arrayed at a predetermined pitch in two dimensions corresponding to multiple electron beams.

6. The electron beam monitoring sensor according to claim 5, wherein the array pitch of said Faraday cups is larger than twice the range of the electron beam of said electron beam collecting part, and is the same as the pitch of multiple electron beams monitored or an integral multiple thereof.

7. The electron beam monitoring sensor according to claim 5, wherein said plurality of Faraday cups are formed on the same substrate having a dielectric layer inserted therein.

8. The electron beam monitoring sensor according to claim 7, wherein said plurality of Faraday cups are each connected to an ammeter for monitoring an electric current of an electron beam by each wire, and said wires are formed by a multi layer structure in said substrate.

9. An electron beam monitoring method, which has the step of irradiating multiple electron beams onto a plurality of Faraday cups arranged in two dimensions at an array pitch of an integral multiple of the beam pitch of said multiple electron beams and formed by tantalum or a heavy metal having an atomic number larger than that of tantalum so as to monitor a beam current of each of the electron beams, and stops irradiation of the electron beam of said multiple electron beams not opposed to said Faraday cup to selectively irradiate only the electron beam opposed to said Faraday cup onto said Faraday cup, wherein the monitoring of each electron beam current includes the addition of current leaked from a first faraday cup to an adjacent second faraday cup.

10. An electron beam monitoring method, which has the step of irradiating multiple electron beams onto a plurality of Faraday cups arranged in two dimensions at an array pitch of an integral multiple of the beam pitch of the multiple electron beams and formed by tantalum or a heavy metal having an atomic number larger than that of tantalum so as to monitor a beam current of each of the electron beams, wherein the monitoring of each electron beam current includes the addition of current leaked from a first faraday cup to an adjacent second faraday cup.

11. The electron beam monitoring method according to claim 9, wherein while applying a negative voltage to said Faraday cup, an electron beam is irradiated onto the position opposed to said Faraday cup.

* * * * *